(12) United States Patent
Komuro et al.

(10) Patent No.: US 7,851,754 B2
(45) Date of Patent: Dec. 14, 2010

(54) CHARGED PARTICLE BEAM SYSTEM

(75) Inventors: Osamu Komuro, Hitachinaka (JP);
Osamu Nasu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 302 days.

(21) Appl. No.: 11/723,579

(22) Filed: Mar. 21, 2007

(65) Prior Publication Data

US 2007/0221845 A1    Sep. 27, 2007

(30) Foreign Application Priority Data

Mar. 23, 2006  (JP)  ............................. 2006-079908

(51) Int. Cl.
*G01N 23/227* (2006.01)

(52) U.S. Cl. ...................... 250/310; 250/306; 250/307; 250/311; 324/751

(58) Field of Classification Search ................ 250/306, 250/307, 310, 311; 324/751
See application file for complete search history.

(56) References Cited

U.S. PATENT DOCUMENTS

| | | | | |
|---|---|---|---|---|
| 4,912,052 | A * | 3/1990 | Miyoshi et al. ............. | 324/751 |
| 4,922,097 | A * | 5/1990 | Todokoro et al. ........... | 250/310 |
| 6,667,476 | B2 * | 12/2003 | Todokoro et al. ........... | 250/310 |
| 6,946,656 | B2 * | 9/2005 | Ezumi et al. ................ | 250/310 |
| 7,239,148 | B2 | 7/2007 | Suhara | |
| 7,514,681 | B1 * | 4/2009 | Marella et al. .............. | 250/310 |
| 2004/0183013 | A1 * | 9/2004 | Nakasuji et al. ............. | 250/310 |
| 2006/0163477 | A1 * | 7/2006 | Nozoe et al. ................ | 250/310 |
| 2009/0057557 | A1 * | 3/2009 | Cheng et al. ................ | 250/310 |

FOREIGN PATENT DOCUMENTS

| | | |
|---|---|---|
| JP | 4-229541 A | 8/1992 |
| JP | 10-125271 A | 5/1998 |
| JP | 2001-52642 A | 2/2001 |
| JP | 2005-166542 | 6/2005 |

OTHER PUBLICATIONS

Japanese Office Action, w/ partial English translation thereof, issued in Japanese Patent Application No. JP 2006-079908 dated Jun. 15, 2010.

* cited by examiner

*Primary Examiner*—Jack I Berman
*Assistant Examiner*—Michael Maskell
(74) *Attorney, Agent, or Firm*—McDermott Will & Emery LLP

(57) ABSTRACT

A charged particle beam system wherein the output of the secondary electron detector is detected while the retarding voltage is varied between the values for which the secondary electrons do not reach the sample and the values for which the secondary electrons reach the sample, and the surface potential of the sample is determined on the basis of the relationship between the retarding voltage and the detected output of the secondary electron detector.

18 Claims, 10 Drawing Sheets

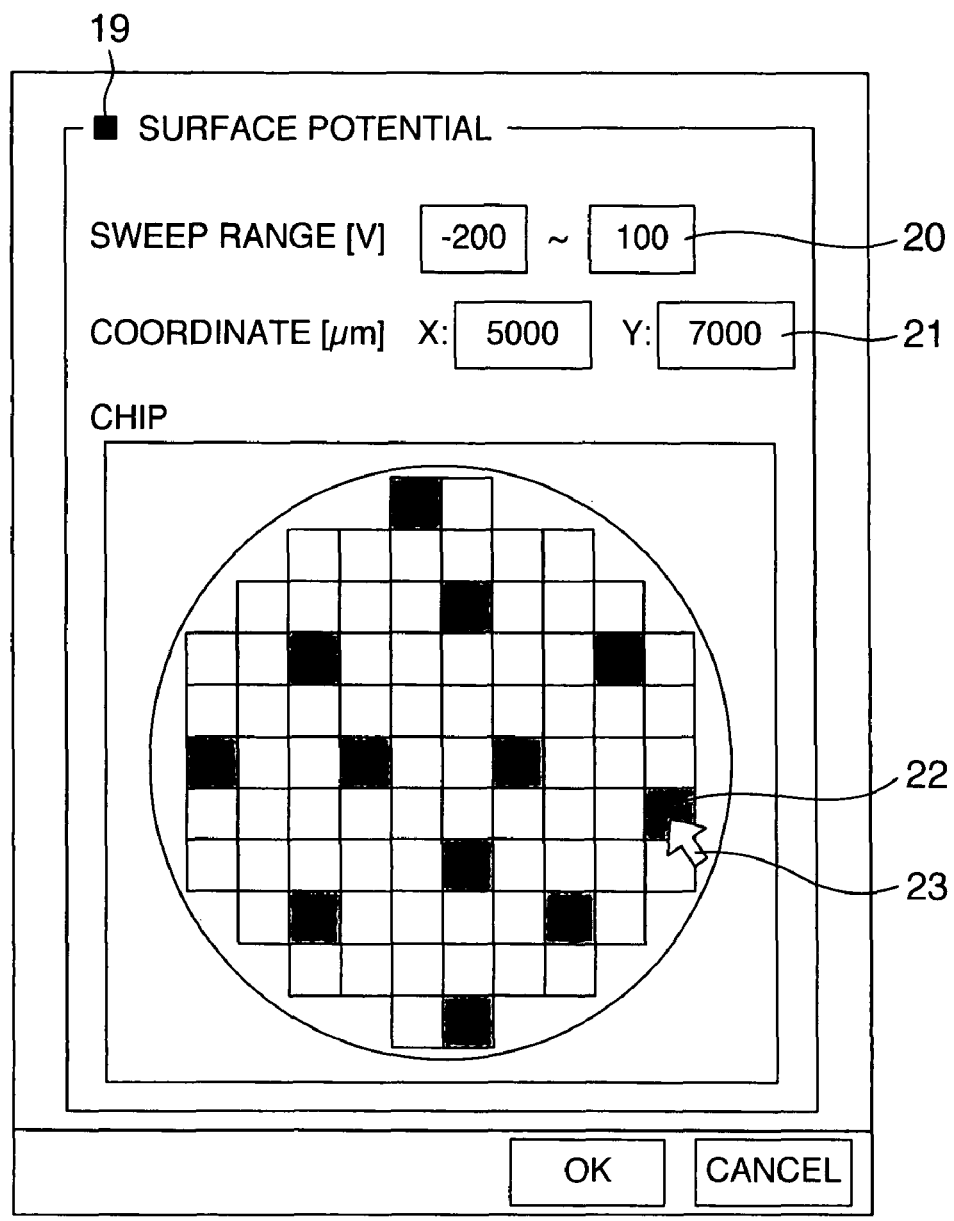

CHARGED PARTICLE BEAM SYSTEM

BACKGROUND OF THE INVENTION

This invention relates to a charged particle beam system and more particularly to such a system wherein beam focusing is controlled by controlling the electric potentials distributed over the surface of the sample through the measurement of those electric potentials.

DESCRIPTION OF THE RELATED ART

A scanning electron microscope (SEM) and a focused ion beam (FIB) apparatus are examples of an apparatus which uses a charged particle beam such as an electron beam or ion beam to inspect, measure and work a sample. In these apparatuses, the beam of accelerated charged particles is focused on the sample by controlling the retarding (decelerating) voltage applied to the objective lens or the sample; the charged particle beam is scanned in a pattern of raster; the secondary electrons emitted from the sample are detected in synchronism with the raster scan; and the two-dimensional signals (image) representative of the superficial shape of the sample can be obtained. The charged particle beam system of most recent appearance is provided with an auto-focus mechanism so as to obtain clear images.

If the sample is intensely charged and the amount of charge is unknown, the focal point shifts according to the amount of charge. Therefore, in effecting the auto-focusing function, it is necessary to expand the variable range of the exciting current for the magnetic objective lens or the retarding voltage. Consequently, the time required to complete the auto-focusing operation is lengthened, resulting in a problem that the measurement time is prolonged.

When the beam is to be focused on the surface of the sample, which is charged, through the control of the magnetic objective lens, the focal point shift due to the charge on the sample surface must be adjusted by adjusting the exciting current for the magnetic objective lens. In this case, however, if the magnification is calculated on the basis of the adjusted exciting current, the calculated magnification does not coincide with the true magnification.

Several methods have been proposed to solve the problem resulting from the electrification of the sample surface, that is, the problem that the auto-focusing operation is prolonged or that the calculated magnification is erroneous. Those methods are disclosed in, for example, patent documents WO2003/007330, JP-2001-52642, and WO99/46798. According to the document WO2003/007330, the amount of electrification of the sample is measured by the electrostatic capacitance measuring device when the sample is carried into the sample chamber. The document JP-2001-52642 discloses the procedure wherein the amount of charge on the sample surface is determined by using the electrostatic capacitance detector installed in the sample chamber. Accordingly, the sample is irradiated by the charged particle beam such as an electron beam having a desired kinitic energy while the retarding voltage is so controlled as to cancel those electric potentials over the sample surface which are measured by the electrostatic capacitance detector. The document WO99/46798 proposes a scanning electron microscope which can eliminate the adverse effects on the image due to the electrification of sample.

SUMMARY OF THE INVENTION

Indeed the above mentioned, electrostatic capacitance measuring device can rapidly measure the surface potential of sample, but it cannot measure the potential in a small area, i.e. the local potential, on the sample surface.

In order to measure the amount of the sample electrification with the system disclosed in the document JP-2001-52642, the sample must be carried near to the electrostatic capacitance detector. This result in a decrease in throughput and a need for an additional provision of a circuitry for controlling the electrostatic capacitance detector.

In the document WO99/46798, the electric potentials over the sample surface are controlled in such a manner that while the secondary electrons are being driven off the sample surface by the primary electrons irradiating the sample surface, the output of the secondary electron detector becomes maximum. In order to employ this method in the case where the sample surface is highly charged, the accelerating voltage for the primary electrons constituting the electron beam must be increased to cause the beam to reach the sample surface. This method, therefore, does not meet the need of today that measurement should preferably be made using as low an accelerating voltage as possible. Further, according to the document WO99/46798, since the condition in which the output of the secondary electron detector becomes maximum is searched for while the secondary electrons are being emitted, the damage to the sample surface due to the electrons hitting thereon is considerable and it is also difficult to determine the condition to give the maximum output.

Furthermore, it has come to be known that there exists the phenomenon of electrification which is different from the conventionally known "wafer electrification". Namely, samples have come to be known which, in the most recent semiconductor manufacturing process, although there is no surface electrification of the wafer when the retarding voltage is absent, the application of the retarding voltage causes the wafer surface to be charged electrically. The cause of this type of electrification is still unknown, but the phenomenon is supposed to be attributed to the change in the surface potential due to the influence of electric or magnetic field existing at the very point of observation. In order to solve this problem, it is necessary to measure the surface potentials under the condition of electric or magnetic filed approximating the condition for actual observation.

The object of this invention is to provide a system for measuring the potentials over the sample surface rapidly with high precision while the retarding voltage is being applied to the sample.

The concrete methodology according to this invention is as follows.

When the retarding voltage is increased to decelerate the charged particles forming the charged particle beam and reaches the level at which the kinetic energy of the charged particles becomes nearly equal to 0 eV, the charged particles impinging on the sample surface can not give rise to secondary electrons. Use is made of this phenomenon, that is, the potentials over the sample surface are estimated by measuring the retarding voltage which reduces to 0 eV the kinetic energy of the charged particles reaching the sample surface.

Concretely described, the specific value of the retarding voltage which minimizes the output of the secondary electron detector is obtained between the value of the retarding voltage at which the charged particle beam does not reach the sample surface and the value of the retarding voltage at which the charged particle beam can reach the sample surface. Then the surface potential of the sample is determined depending on the specific value of the retarding voltage. Accordingly, the charged particle beam having a desired energy is cast onto the sample by controlling the retarding voltage so as to cause the determined surface potential to be offset.

According to the above described constitution, the potentials over the sample surface are measured, and the measured potentials are offset, whereby the charged particle beam having a desired energy can be cast onto the sample. Consequently, the magnification error does not occur, and measurement can be effected at correct magnifications.

Further, since the surface potentials are offset, the time required for auto-focus operation can be shortened. As a result, throughput can be improved for a charged particle beam system which is used to inspect patterns or to measure pattern dimensions.

Furthermore, since the charged particle beam is used, the amount of charge on and within a tiny area of the sample surface can be measured.

Other objects of this invention and other concrete structures according to the invention will be described in the following description of the embodiment of this invention.

BRIEF DESCRIPTION OF THE DRAWINGS

FIG. 11 shows the screen displaying the conditions for performing the surface potential measurement.

DETAILED EXPLANATION OF THE INVENTION

A scanning electron microscope as a first embodiment of this invention will now be described with reference to the attached drawings.

Figure 1:
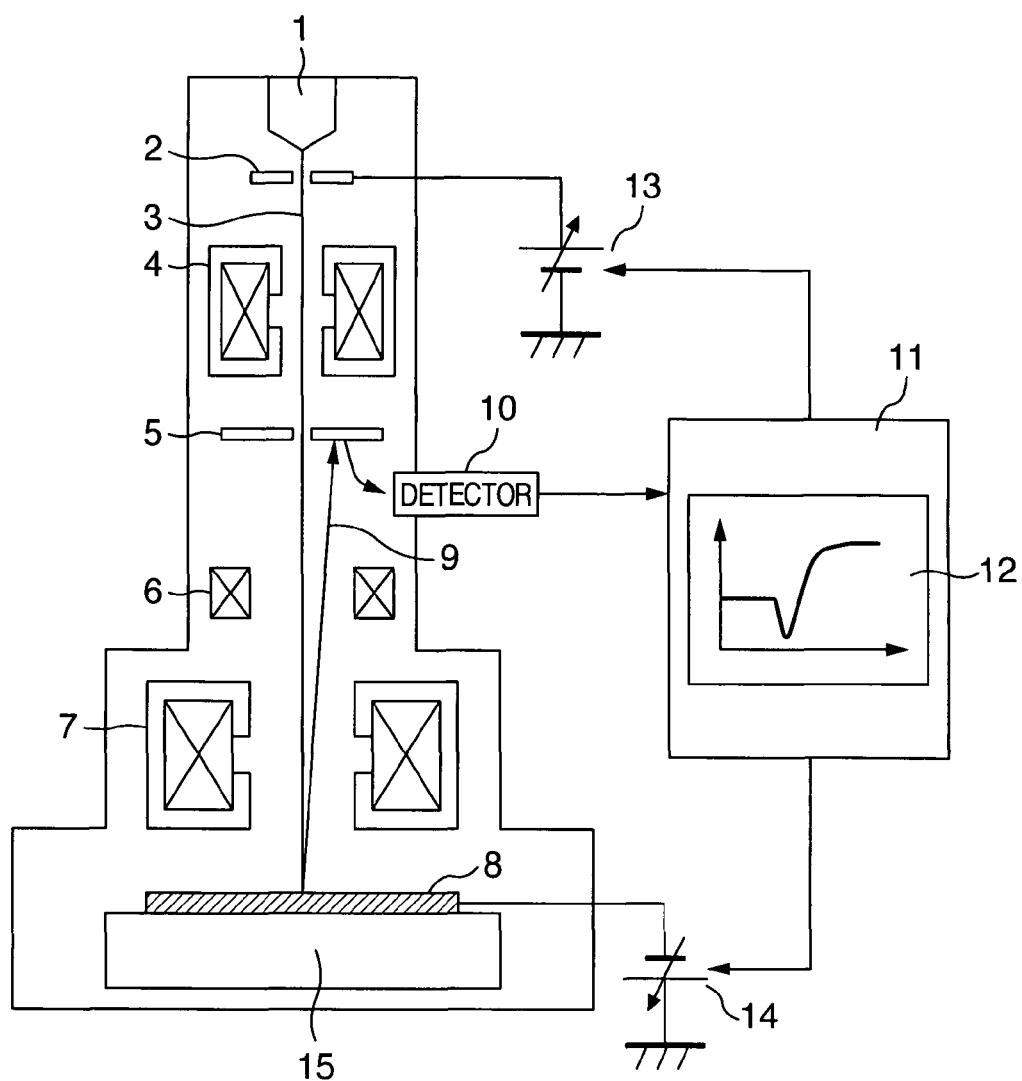
FIG. 1 schematically shows the structure of a charged particle beam system as a first and a second embodiments of this invention.

FIG. 1 schematically shows a first and a second embodiments of this invention. In a scanning electron microscope (SEM), electrons emitted from an electron source 1 are accelerated by a primary electron accelerating electrode 2 to which a voltage is applied from a primary electron accelerating voltage source 13; decelerated by a retarding voltage applied to a sample 8, and converged by a magnetic objective lens 7 to focus upon the surface of the sample. When the beam of electrons hits the sample, secondary electrons are emitted from the sample. The secondary electrons are then accelerated toward the electron source (referred to also as electron gun) 1 by the retarding voltage. The accelerated secondary electrons hit a reflector 5 and the reflected secondary electrons are collected by a secondary electron detector 10.

Accordingly, the output of the secondary electron detector 10 changes depending on the amount of electrons caught by the detector 10.

Here, the scanning of electron beam by using the retarding voltage will be described briefly.

In the operation of a scanning electron microscope or a focused ion beam apparatus, the irradiation energy of the electron beam is controlled by applying a voltage to a semiconductor wafer so as to focus the beam of the charged particles on the wafer without damaging the elements in the wafer surface due to the beam irradiation. This voltage applied to the semiconductor wafer is called "retarding voltage".

The scanning electron microscope produces the shape of the surface of a sample by scanning the electron beam on the sample surface by means of a scanning coil 6, transducing the output of the secondary electron detector 10 into a brightness signal in synchronism with the scanning, and displaying the brightness signal on the screen of a picture tube as the two-dimensional image of the sample surface.

According to this invention, the retarding voltage is controlled; the thus emitted secondary electrons are detected; the sample surface potential is calculated by a computer 11 according to the detected secondary electrons; the surface potential is estimated by a surface potential estimator 12; and the energy of the electron beam reaching the sample is adjusted to a desired value through the control of the retarding voltage.

To obtain a clear image of the sample surface, the beam of charged particles must be exactly focused on the surface. However, it is difficult to exactly focus the beam on the sample surface due to the roughness of the surface or the electric charge existing in the surface. Therefore, the charged particle beam system of today incorporates an auto-focus mechanism therein. According to many auto-focus mechanisms ever proposed, the focal point of the charged particle beam is changed by discretely changing the exciting current for the objective lens or the retarding voltage, and the images of the sample surface are taken for the several focal points. The images associated with the different focal points are processed with a focus evaluation filter (differential, second-order differential, Sobel, Laplacian, etc.) to produce the associated focus evaluation images leading to the calculation of the focus evaluation value (referred to also as sharpness). Here, the weighted sum, the average or the variance, of the focus evaluation images can be used as a measure of the focus evaluation value. These steps of operation are usually performed as an auto-focus operation. The value of that exciting current or retarding voltage which gives the maximum of the focus evaluation value is regarded as the exciting current or the retarding voltage that occurs when the beam is properly focused on the sample surface. Throughout this specification, the operation of changing the exciting current for the objective lens or the retarding voltage is called "sweeping" and the range within which they are swept is termed "sweeping width".

It has been recently observed that some wafers remain kept at a certain fixed potential even after it is electrically grounded. This fixed potential is attributed to the polarization of polar material in the photoresist due to the friction generated during the process of resist coating by using the spin coater, or ascribed to the electrification due to plasma etching.

Especially in the case where the SOI (silicon on insulation) technique is employed, that is, where an insulation film is formed on a wafer and then semiconductor patterns are formed on the insulation film, it is well known that some wafers are electrified at a potential of several hundreds of volts. Under such high electrification, there is cause a problem that the auto-focus operation needs a relatively long time, resulting in the decrease in overall inspection throughput.

Further, when focusing is performed by the objective lens while the sample surface is electrically charged, the following problem is incurred. Whenever a charged particle beam system is used, the magnification is calculated on the assumption that the sample is not electrified at all. If the proper focus is not attained, the magnification is calculated on the assumption that the height of the sample has been changed. In case of a scanning electron microscope, however, if the sample surface is negatively charged, the electron beam is decelerated by the negative charge so that the focal point is shifted. If the shift of the focal point is adjusted by adjusting the exciting current for the objective lens and if the magnification is calculated depending on the adjusted exciting current, then the calculated magnification is different from the true magnification. In the case where the charged particle beam system is used to measure the dimensions of the patterns, a problem is incurred that the right dimensions cannot be determined.

The following embodiment of this invention will be proposed in consideration of the above mentioned problem.

Figure 2:
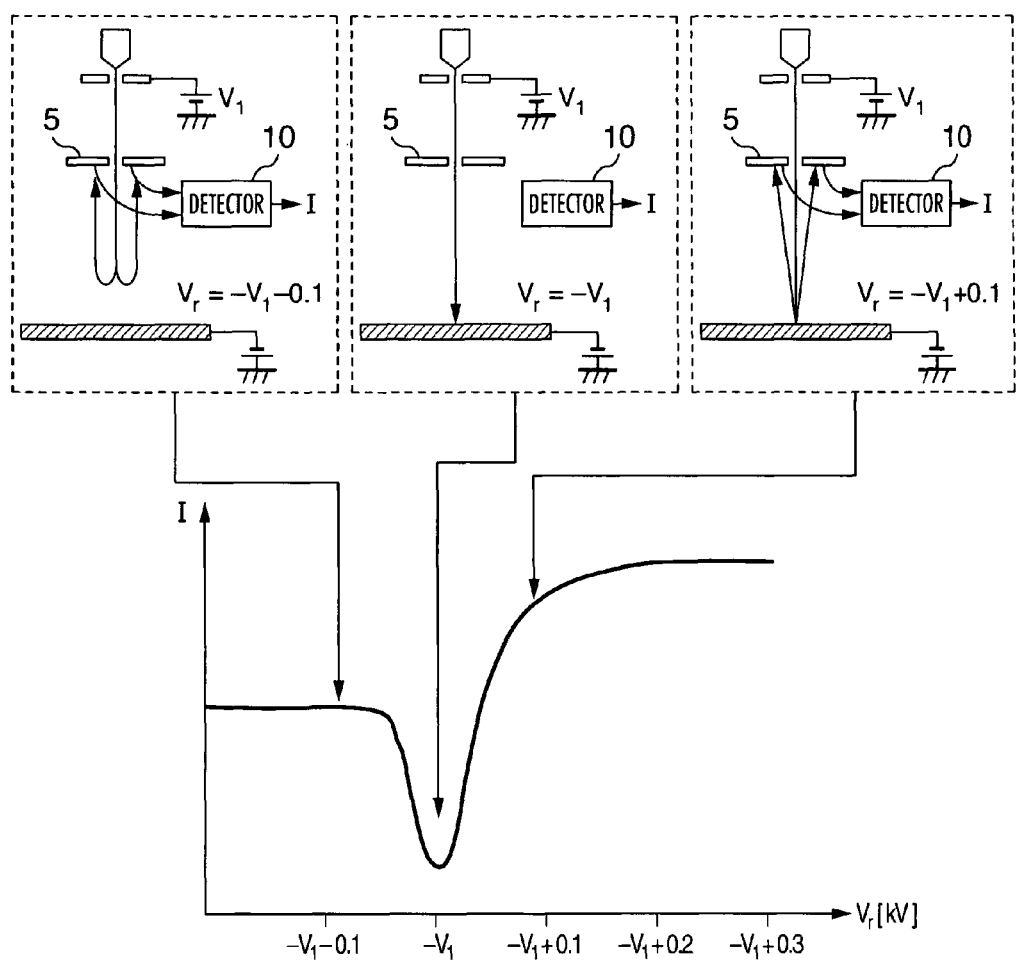
FIG. 2 shows the relationship between the retarding voltage and the output of the secondary electron detector in case where there is no potential over the sample surface.

The principle for measuring the electric potential of the sample surface will be described in reference to FIG. 2. Here, it is assumed that there is no electrification of the sample surface. Let the accelerating voltage for the electron beam and the retarding voltage be denoted by $V_1$ and $V_r$, respectively. As an electron is negatively charged, the retarding voltage is set negative. If $V_r$ is given such a value that $V_r < -V_1$, the primary electrons forming the beam cannot reach the sample and are turned back toward the electron gun before reaching the sample. Upon reaching the reflector 5, the primary electrons cause secondary electrons to be emitted from the surface of the reflector 5. The secondary electrons are then detected by the secondary electron detector 10. The primary electrons which are turned back and hit the lower surface of the reflector 5 have a velocity equal to the velocity at which the primary electrons emitted from the electron gun just pass through the aperture of the reflector 5 toward the sample. Accordingly, the amount of the secondary electrons emitted from the reflector 5 is constant irrespective of the magnitude of the retarding voltage $V_r$. Therefore, the output of the secondary electron detector 10 remains almost constant irrespective of the magnitude of the retarding voltage $V_r$.

Under the condition that $V_r = -V_1$, where the accelerating voltage equals the retarding voltage, the kinetic energy of the primary electrons barely reaching the sample is 0 eV (zero electron volt). In this case, since the primary electrons cannot generate secondary electrons at the sample surface, the output of the secondary electron detector 10 goes down.

In the case where $V_r > -V_1$, the primary electrons of the beam emitted from the electron gun hit the sample surface so that secondary electrons are emitted from the sample surface and detected by the secondary electron detector 10. Since the kinetic energy of the primary electrons reaching the sample surface increases as the retarding voltage $V_r$ is increased, the amount of the emitted secondary electrons increases as the retarding voltage $V_r$ is shifted in the positive direction.

As understood from the above description, If $V_r < -V_1$, the output of the secondary electron detector 10 remains constant irrespective of the magnitude of the retarding voltage $V_r$; if $V_r = -V_1$, where there is no secondary electron emitted, the output of the secondary electron detector 10 goes down; and if $V_r > -V_1$, where the energy of the primary electrons hitting the sample surface varies depending on the magnitude of the retarding voltage, the amount of the secondary electrons emitted from the sample surface varies depending on the energy of the primary electrons so that the output of the secondary electron detector 10 varies depending on the magnitude of the retarding voltage.

Figure 3:
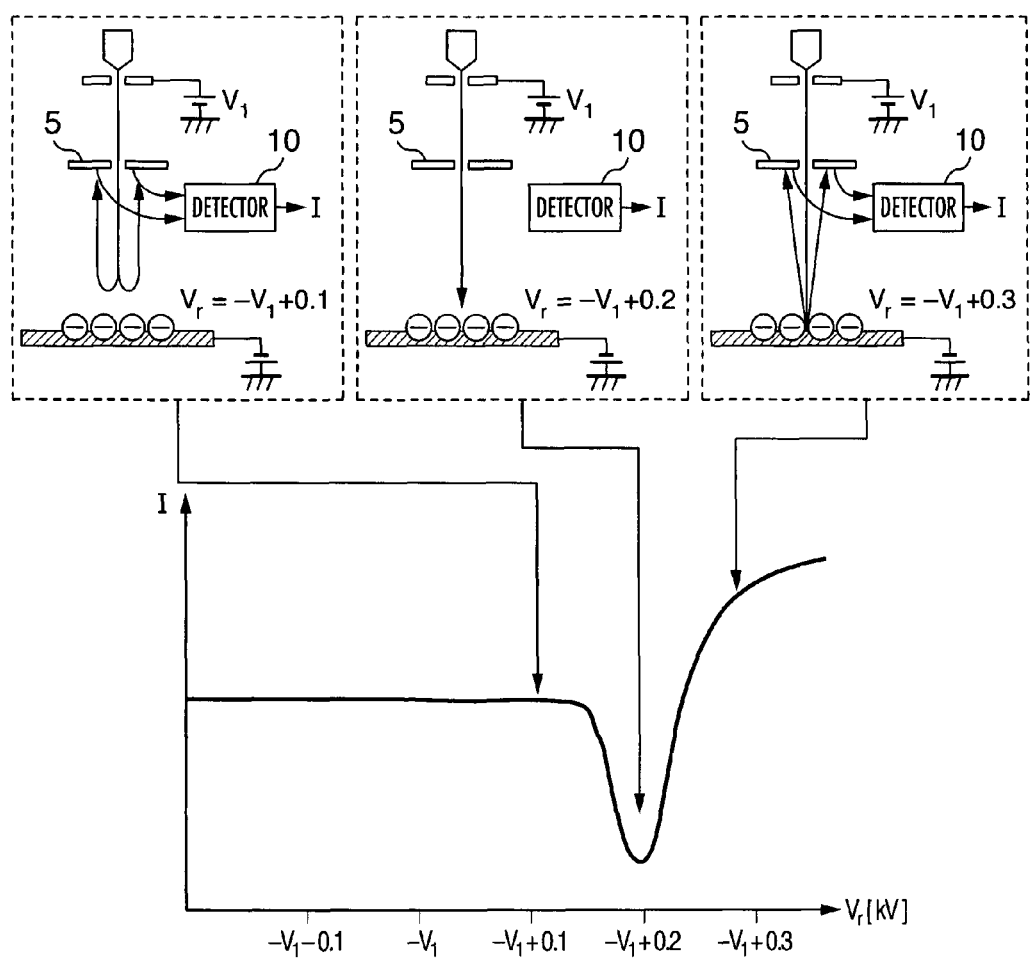
FIG. 3 shows the relationship between the retarding voltage and the output of the secondary electron detector in case where there is a potential of –0.2 kV over the sample surface.

In the foregoing description, the case is explained where the sample surface is not previously electrified. Now, description is made of the case with reference to FIG. 3 where the sample surface is electrically charged. In FIG. 3, the sample surface is kept at an electrostatic potential of −0.2 kV. In this case, as compared with the case shown in FIG. 2, the sample surface is charged at −0.2 kV so that the potential of the sample surface becomes $-V_1$ when $V_r = -V_1 + 0.2$ kV. As seen from FIGS. 2 and 3, the $V_r$–I characteristic curve for the sample surface without electrification must be shifted by 0.2 kV in the positive direction along the abscissa $V_r$ to obtain the $V_r$–I characteristic curve for the charged sample surface. Namely, since the $V_r$–I characteristic curve shifts depending on the potential of the sample surface, the potential can be determined by measuring the amount of the shift.

The method of measuring the potential of the sample surface will be described in detail with reference to the flow chart shown in FIG. 4. First, the retarding voltage $V_r$ is set at the initial voltage that prevents the primary electrons from reaching the sample surface (S01). Here, it is necessary to set the initial voltage at an appropriate value in consideration of the anticipated surface potential of the sample. For example, if it is known a priori that the sample surface is charged at about 0.1 kV, it is required to determine the initial value of the retarding voltage such that $V_r < -V_1 - 0.1$ kV. Then, an image can be obtained by two-dimensionally scanning the beam of the primary electrons over the sample surface at an appropriate magnification (S02). Since the brightness of the image is proportional to the output of the secondary electron detector, the average brightness of the image is calculated (S03). Now, the retarding voltage is increased by an amount of Step kV (S04) and the above described operation is repeated until the preset repetitive number N is reached (S05, S06).

By sweeping the retarding voltage, the surface potential $V_{sp}$ is calculated on the basis of the average brightness of the images obtained corresponding to the swept retarding voltages (S07). Then, the retarding voltage is controlled in such a manner that the beam of the primary electrons can hit the sample surface with a desired energy of $V_{acc}$ eV (S08). Here, in consideration of the accelerating voltage $V_1$ for the primary electrons and the surface potential $V_{sp}$, the retarding voltage $V_r$ must be given a value such that $$V_r = -V_1 + V_{acc} - V_{sp} \quad (1)$$

Figure 4:
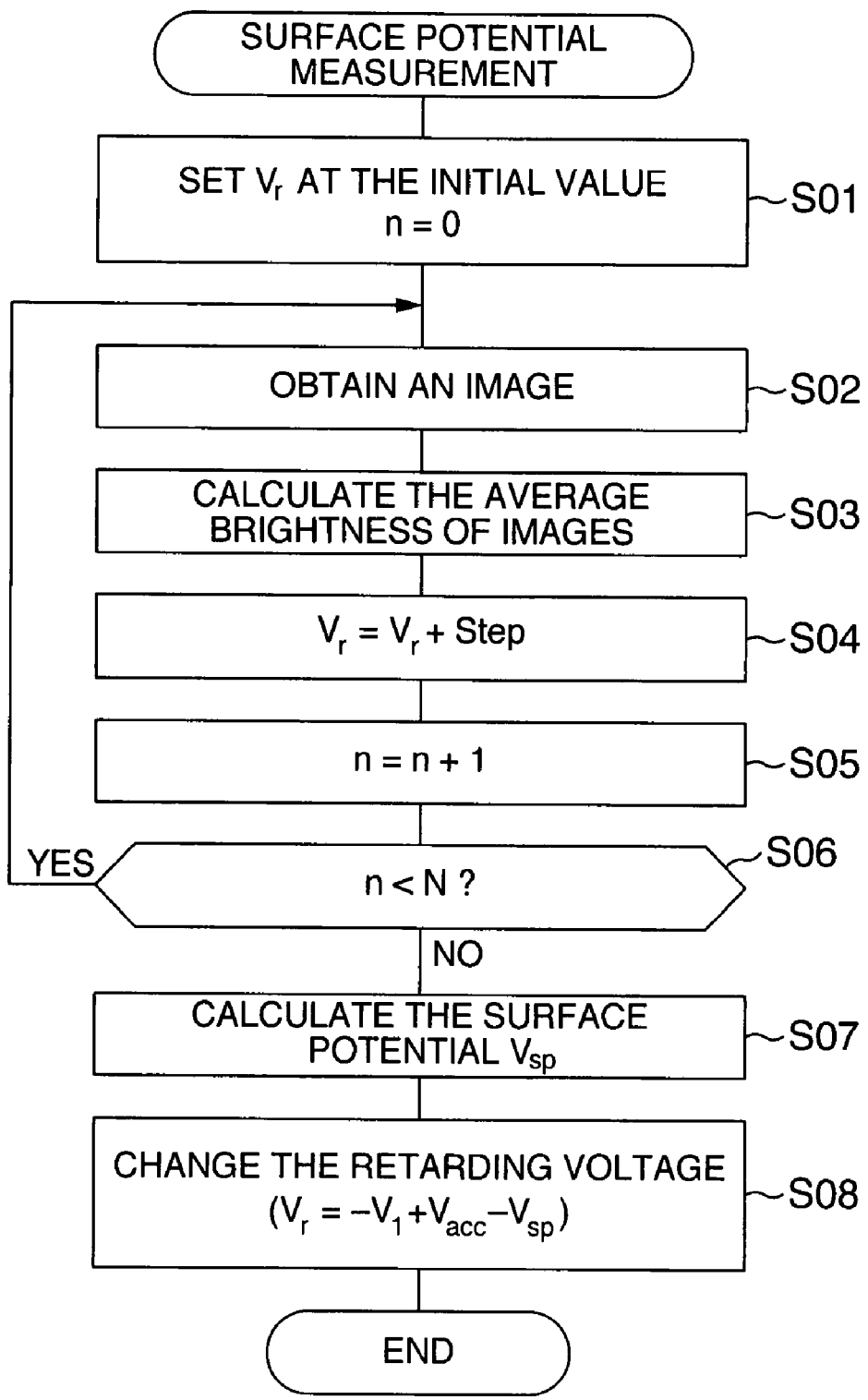
FIG. 4 is a flow chart for the measurement of the surface potential.

In the description given for FIG. 4, $V_r$ is increased positively, but it is also possible to decrease $V_r$ in the negative direction. Moreover, a similar effect can be obtained by one-dimensionally scanning the beam of the primary electrons over the sample surface, obtaining the resultant one-dimensional signals from the secondary electron detector, and using the average of the one-dimensional signals, instead of obtaining the two-dimensional images in (S02) step.

Furthermore, the program to execute the operation according to this flow chart can be incorporated in a scanning electron microscope or a charged particle beam system.

According to the conventional auto-focus mechanisms described above which serve to evaluate the sharpness of pattern, the edge enhancing treatment typically known as the differential treatment must be employed in the evaluation of the obtained images. In order for the edge enhancing treatment to be effective, the S/N ratio of the image must be greater than a certain minimum value so that the noise contained in the image may not be enhanced. To keep the S/N ratio above a certain level in a scanning electron microscope, the ratio is generally improved by using the frame accumulation technique or by reducing the noise through the smoothing filter before the differential treatment. These measures, however, result in a problem that the operation of auto-focusing is lengthened. On the other hand, according to this invention, the sample surface potential can be measured even where there is no pattern on the sample surface. It is only necessary to obtain the average brightness of the acquired images. Accordingly, the auto-focus technique of this invention is little affected by noise and does not need to resort to the frame accumulation technique or the noise reduction through the smoothing filter for improving the S/N ratio. As a result, the auto-focus mechanism according to this invention can operate more quickly than the conventional auto-focus mechanism wherein the sharpness of pattern must be evaluated.

Figure 5:
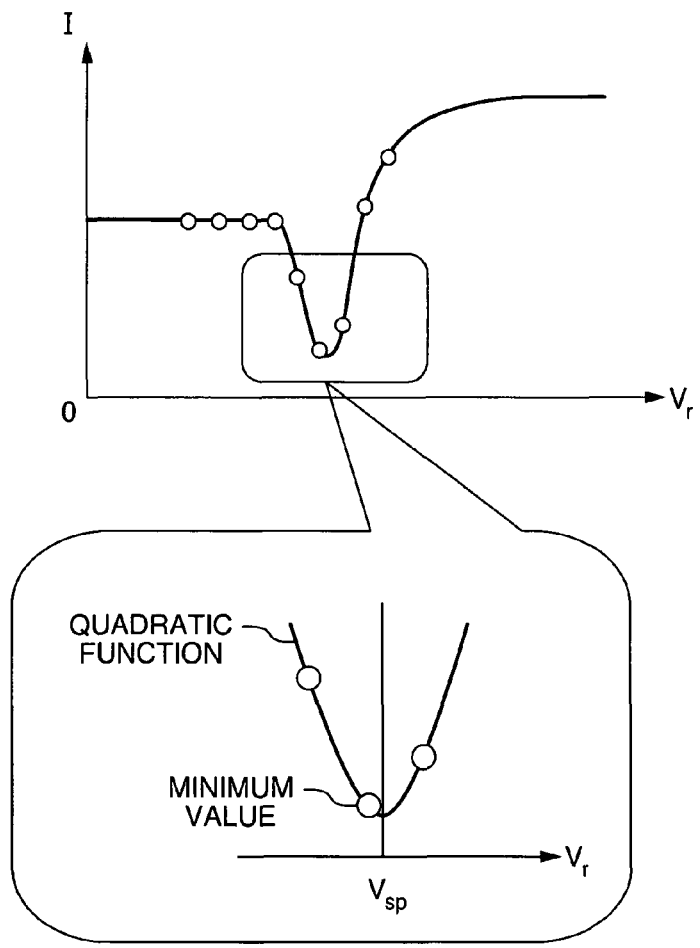
FIG. 5 graphically shows a procedure for calculating the surface potential.

With reference to FIG. 5 is now described a method for deriving the surface potential $V_{sp}$ from the plural values of retarding voltage $V_r$ and the average brightness of the images corresponding to the plural values (proportional to the output I of the secondary electron detector). The specific data point which gives the minimum brightness is obtained on the basis of the output I of the secondary electron detector acquired by sweeping the retarding voltage discretely. This data point and two additional data points located before and after it, are used to determine the curve of a quadratic function that passes the three data points. This method can provide high precision for the particular value of the retarding voltage for which the output of the secondary electron detector is minimized even where the retarding voltage is discretely changed.

Another embodiment is described below with respect to the data points used to obtain such a quadratic function as mentioned above. When the primary electrons cannot reach the sample surface, the output of the secondary electron detector or the average brightness of images is about constant. This constant value is, for example, set as a threshold. The data points whose values are less than this threshold are used to determine the minimum value. Curve fitting using quadratic functions is performed on these data points whose values are less than the threshold. Hence, there is obtained with high precision that value of the retarding voltage for which the output of the secondary electron detector is minimized even where the retarding voltage is discretely changed.

Figure 6:
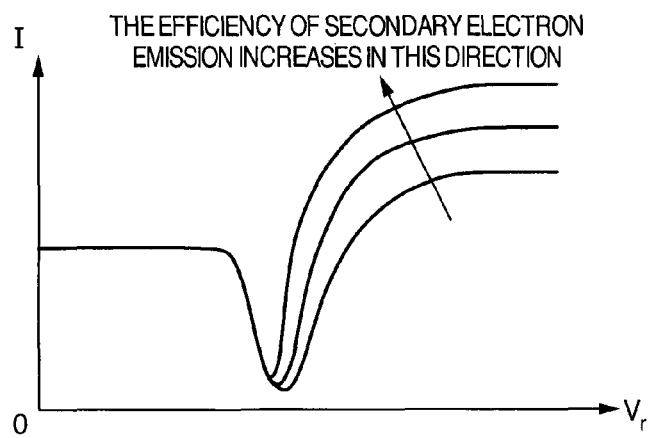
FIG. 6 graphically shows the variation in the efficiency of the secondary electron emission in terms of $V_r$–I characteristic.

There, however, is a case where only the acquisition of the value of the retarding voltage for which the output I of the secondary electron detector is minimized is not always enough for the purpose, depending on the difference in the material of sample. In the variable range of retarding voltage where the primary electrons are turned back, the output of the secondary electron detector remains constant irrespective of the value of the retarding voltage or the difference in the material of sample. On the contrary, in the variable range of the retarding voltage where the primary electrons can reach the sample surface, since the amount of secondary electrons emitted from the sample depends on the efficiency of secondary emission of electrons, the $V_r$–I characteristic curve changes as seen in FIG. 6 if the efficiency of secondary emission of electrons is varied. It is therefore concluded that the value of the retarding voltage for which the average brightness I of images is minimized depends on the material of sample. Hence, an offset voltage $V_{off}$ is previously determined to offset the "deviation" of the retarding voltage caused depending on the material of sample, and the resultant retarding voltage $V_r$ should be adjusted in such a manner that $$V_r = -V_1 + V_{acc} - V_{sp} + V_{off} \quad (2)$$

In general, it is impossible to obtain a properly focused image even though the surface potential is determined by using the above described method and the retarding voltage is controlled according to the above expression (2). That is because while the sample surface potential due to the charges on the surface can be offset by controlling the retarding voltage, the focus deviation due to the difference in the height of the sample is yet to be offset. In order to properly focus the electron beam on the sample surface, the focal point must be controlled by, for example, changing the exciting current for the magnetic objective lens. If the sample stage for holding the sample is capable of fine movement in the vertical direction, the height of the sample may be finely controlled by moving the sample stage vertically.

In this embodiment, the retarding voltage $V_r$ is swept, but the accelerating voltage $V_1$ for the primary electrons or both the accelerating voltage $V_1$ and the retarding voltage $V_r$ may be swept. For the surface potential can be determined by calculating the sum of or the difference between, the accelerating voltage $V_1$ for the primary electrons and the value of the retarding voltage $V_r$ for which the output of the secondary electron detector is minimized.

In this case, the determined surface potential may be superposed on the voltage to be applied to the sample stage or the electrode for accelerating the primary electrons, or shared in superposition between the sample stage and the electrode.

Embodiment 2

The retarding voltage may be increased in the positive or negative direction. If the retarding voltage is increased in the positive direction starting at the value thereof for which no secondary electron is emitted from the sample, then such an advantage can be obtained as follows. The value of the retarding voltage $V_r$ for which the output of the secondary electron detector is minimized has only to be known to determine the surface potential. Therefore, the measurement can be finished at the time when the output of the secondary electron detector becomes minimum or when the data enough to effect the above mentioned curve fitting have been collected. The primary electrons have not yet hit the sample surface up to this time and the obtained advantage is that the damage to the sample due to the irradiation thereof by the primary electrons can be prevented and that the electrification of the sample due to the irradiation thereof by the primary electrons can also be avoided. Further, if the variable range of the retarding voltage is limited to the above mentioned region, the measurement can be completed in a short time, resulting in an improvement on the throughput.

Embodiment 3

Semiconductor circuit patterns are usually integrated in the surface of a sample called a wafer. A critical dimension measurement SEM is widely used, for example, to measure the width of a conductive line of such a pattern. The basic structure of such a dimension-measuring SEM is also as shown in FIG. 1. As shown in FIG. 1, a wafer is fixed on the sample stage 15, the stage is moved so as to enable the beam of the primary electrons to irradiate the pattern to be observed, and the desired part of the pattern can be observed.

In the ordinary measurement of semiconductor circuit patterns, there is a case where several hundreds of measurement points in a single wafer are subjected to a required measurement at the stage of trial fabrication. It often happens that even after mass production is started, several tens of points in a single wafer are subjected to a prescribed measurement. In such a case, the throughput is deteriorated if the surface potential measurement is performed at all the measurement points according to the method described above in Embodiment 1. The deterioration of the throughput can be prevented by actually measuring the surface potentials at several points in a wafer before the measurement of pattern dimensions and accordingly estimating the surface potentials at arbitrary measurement points on the basis of the actually measured surface potentials.

Figure 7:
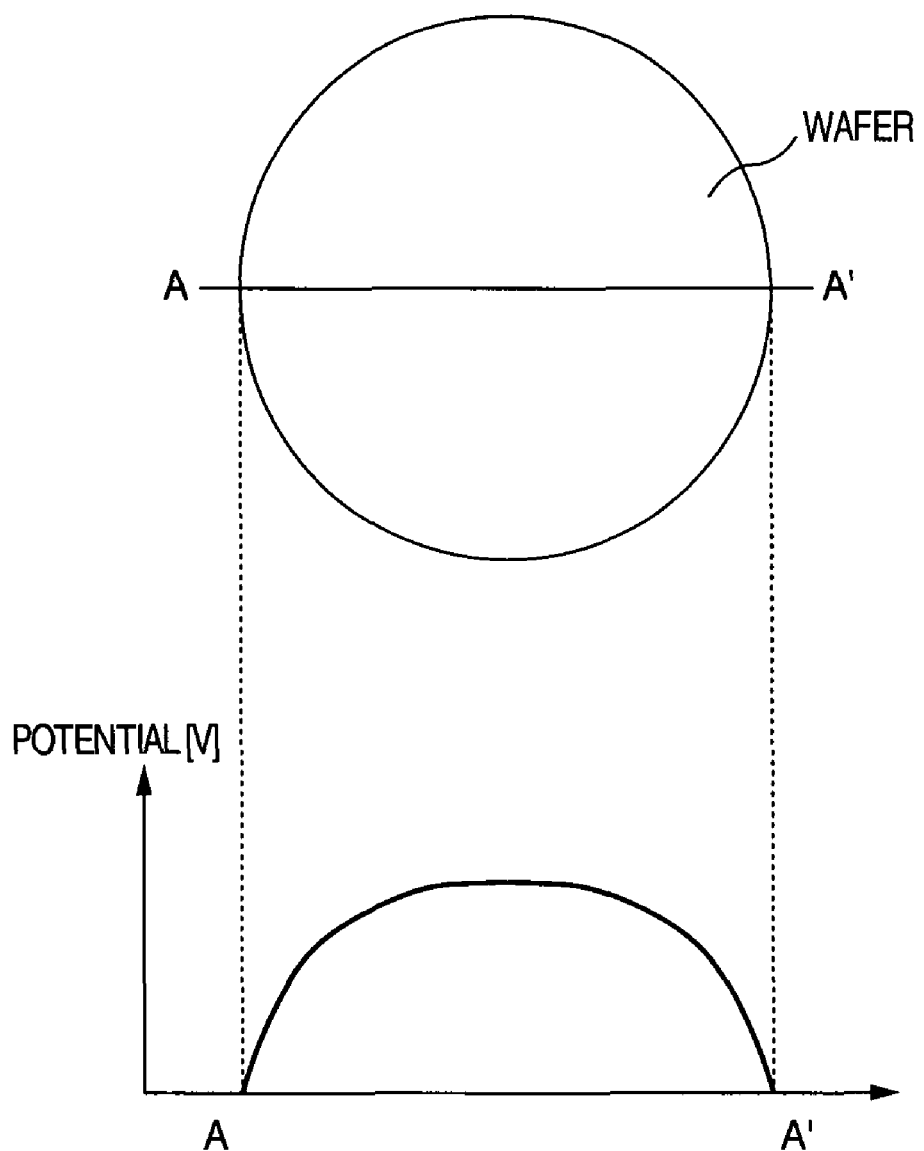
FIG. 7 shows the large-area electrification of wafer.
Figure 8:
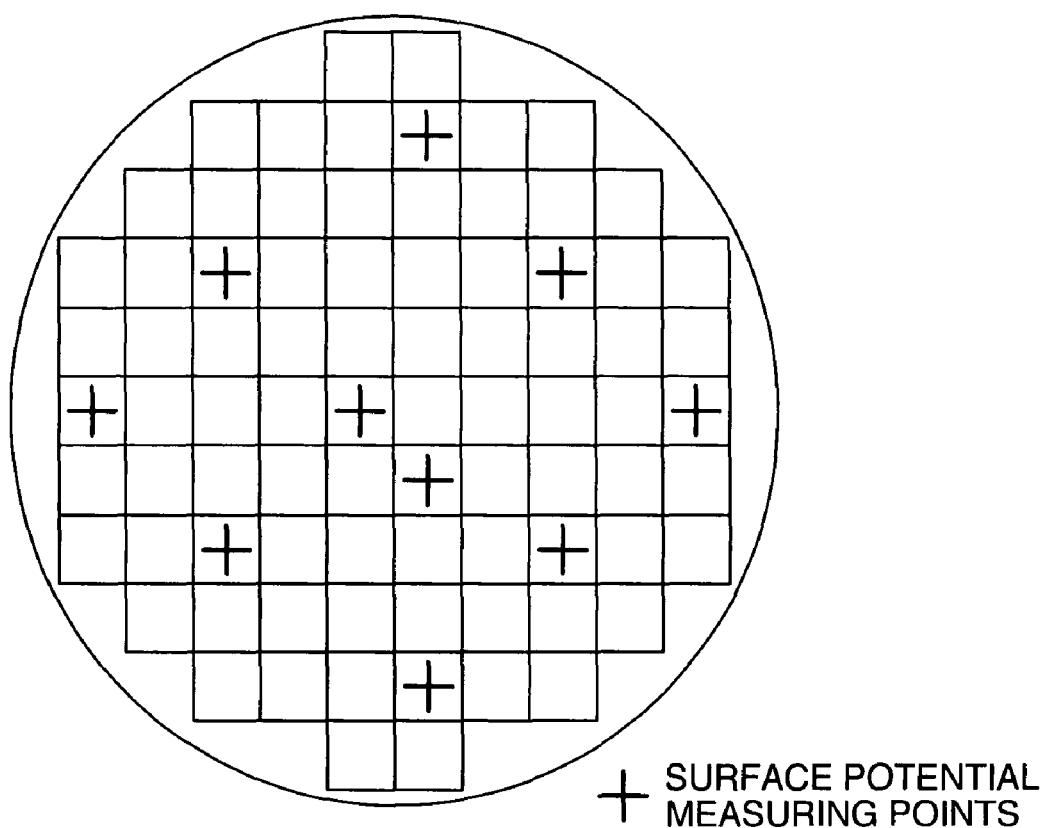
FIG. 8 shows measurement points over a wafer at which the surface potential is measured.

In most cases, the entire surface of the wafer is electrified, with the central part of the wafer having a higher potential and the peripheral part thereof having a lower potential, as shown in FIG. 7. It is therefore preferable to represent the distribution of the surface potentials approximately with such a function as shown in FIG. 7. For example, as shown in FIG. 8, the surface potential is measured at ten points on the wafer. Then, the surface potential $V_{sp}(x, y)$ at an arbitrary coordinate point (x, y) can be approximated on the basis of the surface potentials obtained at the ten measurement points according to the following expression (3).

$$V_{sp}(x, y) = a \times r^3 + b \times r^2 + c \times r + d \quad r = (x^2 + y^2)^{1/2} \quad (3)$$

, where x and y are the abscissa and the ordinate of the rectangular coordinate system with its origin located at the center of the wafer, and a, b, c and d are constant coefficients.

The coefficients a, b, c and d may be determined through the use of the least square method so that the resultant cubic function can best fit the curve that approximates the data obtained by the measurement. In this example, the curve fitting function is derived on the assumption that the potential distribution is symmetric with respect to the center of the wafer, but any other type of expression for approximation may be employed if it is appropriate in approximating the potential distribution over the wafer surface. Moreover, the surface potential at an arbitrary point on the wafer may be determined by the interpolation on the basis of the data collected at the plural measurement points.

The dimension-measuring SEM enables an unattended operation in measurement by operating in accordance with a series of measuring steps recorded in a file referred to generally as a recipe. The measuring operation according to the recipe will be described below with reference to FIG. 9. In case where a single wafer is measured by using a recipe, the wafer is first carried into the sample chamber, and then the potential over the wafer surface is measured. Namely, the first measuring point on the wafer surface defined in the recipe is reached (S20) and the surface potential there is measured (S21). Such measurement is repeated for all the measuring points defined in the recipe (S22). When the measurement of surface potential is completed, such a surface potential approximating function $V_{sp}(x, y)$ as the above expression (3) is calculated (S30).

At the beginning of the pattern dimension measuring steps, the first measuring point is reached by the movement of the sample stage (S40). Thereafter, the surface potentials at the measuring points are determined by using the surface potential approximating function $V_{sp}(x, y)$ obtained in the step S30, the retarding voltage is controlled by using the above expression (2), and the effect of the surface potential is offset at each measuring point (S41). After these steps, the auto-focus operation is performed (S42), the pattern to be measured is located (S43), and the dimensions of the targeted pattern are finally measured (S44).

In general, the amount of electrification of wafer surface may change largely depending on semiconductor manufacturing processes. It may also happens that different wafers have different amounts of surface electrification even in the same manufacturing process. According to the methods described in the foregoing, since the surface potentials at plural measuring points must be determined even when there is little or no electrification in the wafer surface, then the measurement efficiency cannot be said to be very high. The electrification of wafer is normally greater at the center of the wafer than at the periphery thereof. The surface potential is first measured in the wafer center to determine whether the electrification in the wafer center is considerable or not. If the electrification in the wafer center is considerable, the measurement of the wafer surface potential is performed, and if the electrification in the wafer center is negligible, such measurement is omitted. Accordingly, the deterioration of the throughput can be prevented.

Figure 9:
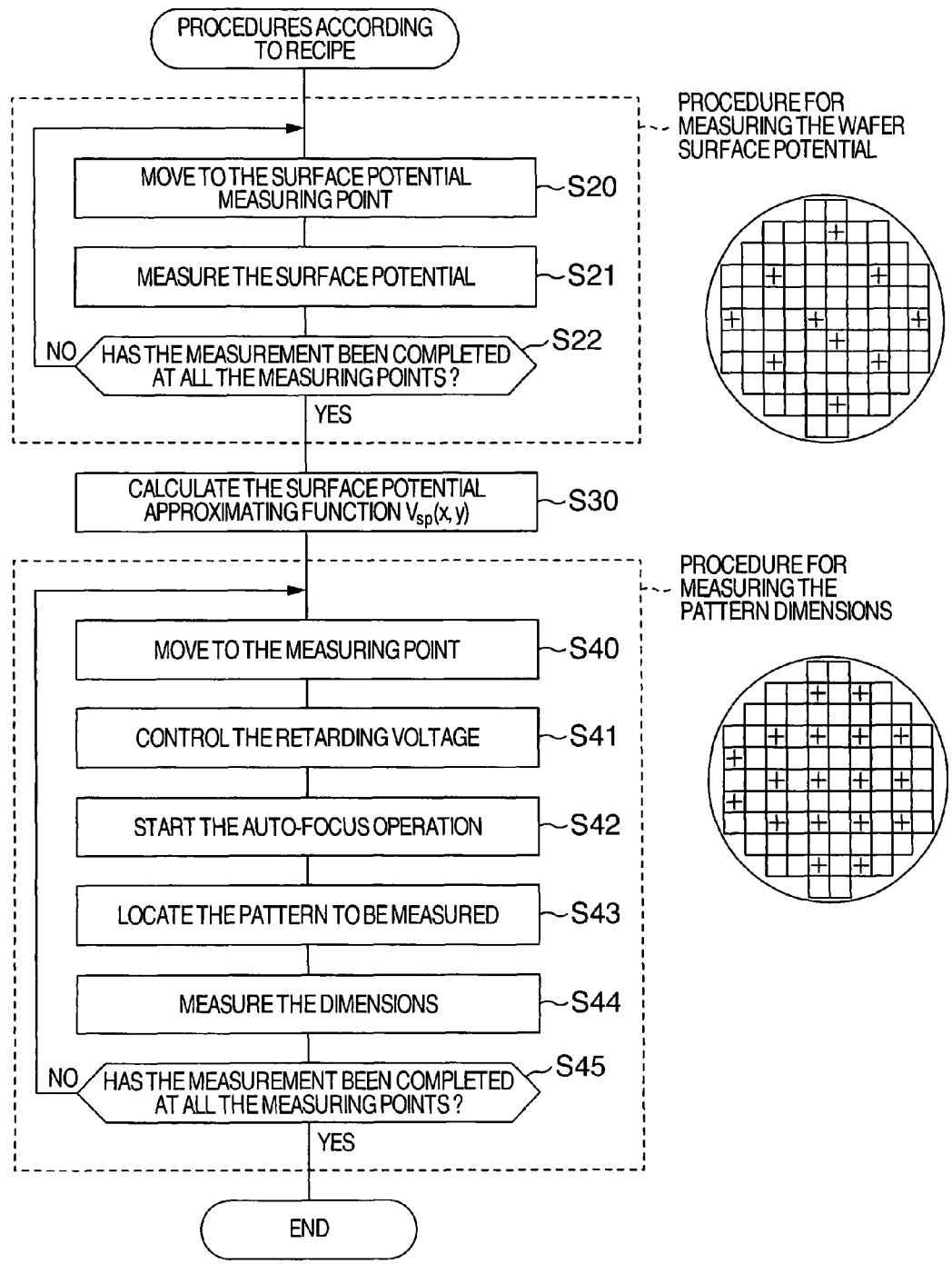
FIG. 9 shows in flow chart the procedure of measuring the potential over the wafer surface and the procedure of correcting the surface potential.
Figure 10:
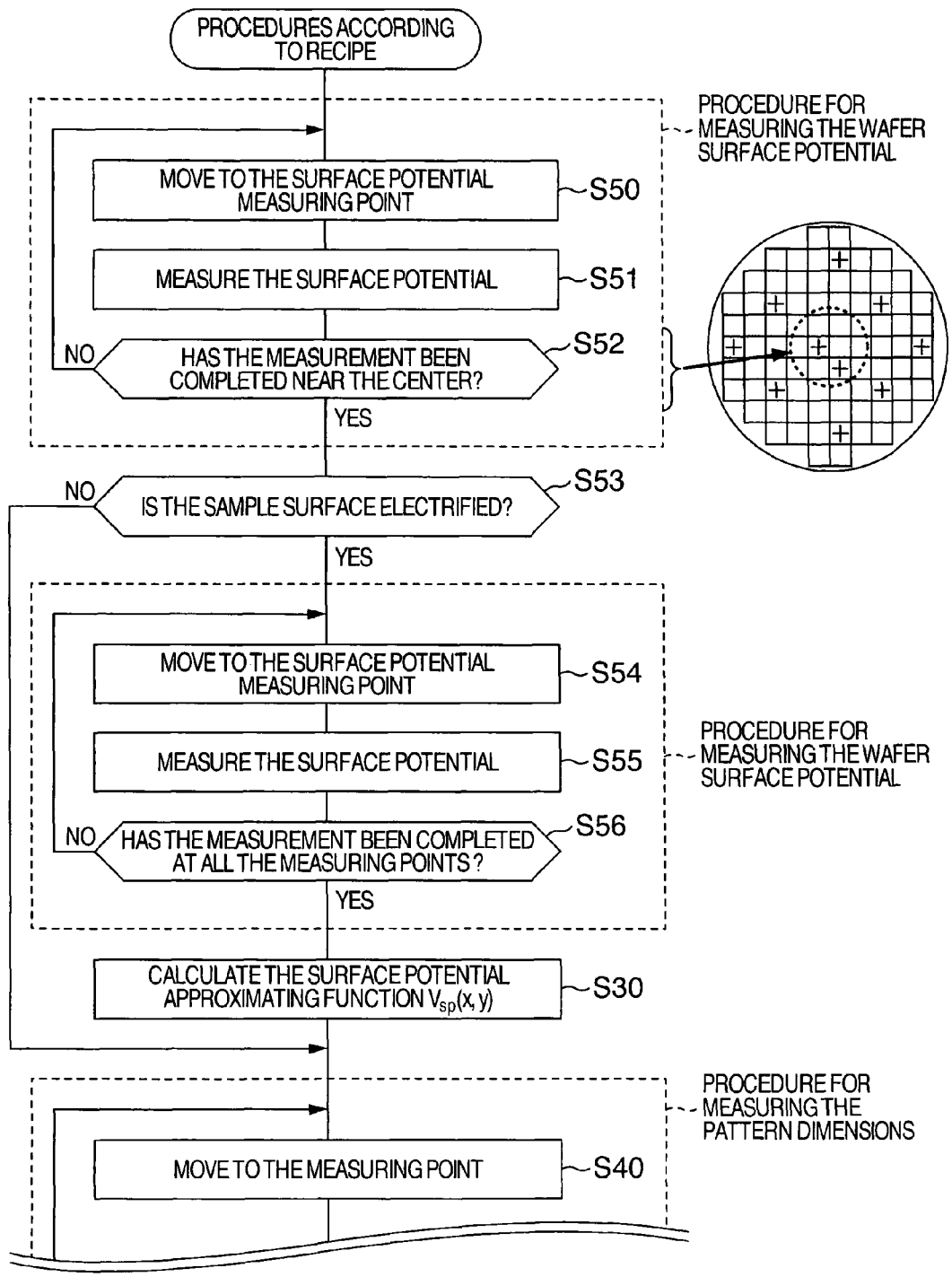
FIG. 10 shows in flow chart the procedure of measuring the potential over the wafer surface.

The flow of the above described series of steps is illustrated in FIG. 10. As seen in FIG. 10, the steps S20 through S30 shown in FIG. 9 are modified. Namely, the surface potential in the wafer center is first measured in the wafer surface potential measuring procedure 1. As seen in FIG. 10, the surface potentials are measured at the measuring points located within a circle of a predetermined radius (S50, S51, S52). In the case shown in FIG. 10, the surface potentials are measured at two measuring points. Thereafter, the surface potential near the wafer center is estimated on the basis of the surface potentials determined in the step S51. Here, it suffices to strike the average of the surface potentials determined at the two measuring points to obtain the estimated potential near the wafer center. Then, if the surface potential near the wafer center is lower than a predetermined threshold, the wafer surface is deemed to be "void of electrification" (S53). When the judgment "void of electrification" has been passed, the flow proceeds to the pattern dimension measuring procedure. On the other hand, if the surface potential near the wafer center is higher than the predetermined threshold, the wafer surface is deemed to be "electrified". When the judgment "electrified" is passed, the measurement of surface potentials is further performed at additional measuring points distributed over the sample surface (S54, S55, S56). Thereafter, the surface potential approximating function $V_{sp}(x, y)$ is obtained (S30). In this case shown in FIG. 10, the additional surface potentials are measured at the eight remaining measuring points.

The screen image illustrating how the wafer surface potential is measured according to the recipe will now be described with reference to FIG. 11. The first data to be defined is the flag 19 indicating whether the surface potential measurement is performed or not. Since the presence or absence of the surface electrification depends on samples, it should first be determined whether the surface potential measurement is performed or not. The second data to be defined is the sweeping range 20 for the surface potential measurement. Of course, different samples have different surface potentials, but if the surface potentials at the selected measuring points are previously known to fall within a certain range of values, the time required for the surface potential measurement can be shortened by appropriately narrowing the sweeping range. The third data to be defined is the position of the measuring point where the surface potential measurement is performed. In the example shown in FIG. 11, the coordinates 21 in a chip are specified and the chip 22 whose surface potential is to be measured is selected by the mouse pointer 23. Since the chip whose surface potential is to be measured can be selected by manipulating a mouse, the selection of the chip is simplified.

In the above described screen image, three independent pieces of data are inputted. In the application of the sample surface potential measuring technique according to this invention, as already described in Embodiment 1, there should not necessarily be patterns in the sample surface and therefore the surface potential measurement may be performed at any measuring point. Consequently, when a recipe is prepared, it is possible to considerably reduce the number of the pieces of data inputted by a user. For example, only the number of the measuring points may be defined while the measuring points where the surface potentials are actually measured are randomly selected by the system itself. Alternatively, it is only specified whether the surface potential offset is performed or not, and the surface potential measurement may be performed at the plural coordinate points recorded previously in the system.

According to the above described method, several to ten measuring points are enough for the surface potential measurement and therefore the deterioration of throughput can be limited to the minimum. Further, since the wafer surface potential can be appropriately controlled, the sweeping range for the auto-focus operation can be narrowed so that the time required for the auto-focus operation can be shortened. Even in case where the wafer surface potential is measured, if there are many measuring points for pattern dimension measurement, the auto-focus operation at each measuring point can be omitted or the time required therefore can be shortened. Consequently, the time required for executing the recipe can be shortened. Furthermore, since the surface potential is controlled, the error of magnification arising from the surface electrification can be eliminated and the correct measurement of dimensions can be secured.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam system comprising:
   a source of a charged particle beam;
   a secondary electron detector for detecting secondary electrons emitted from a sample;
   a sample stage for supporting the sample;
   a power source for applying a variable voltage to the sample stage; and
   a controller for controlling the power source, wherein the controller comprises a computer readable medium containing instructions such that when executed, the controller:
   varies the voltage to be applied to the sample stage between the value for which the charged particle beam does not reach the sample and a value for which the charged particle beam reaches the sample;
   measures the output of the secondary electron detector while the voltage to be applied to the sample stage is being varied; and
   determines the surface potential of the sample on the basis of the relationship between the varied voltage and the detected output of the secondary electron detector.

2. A charged particle beam system as claimed in claim 1, wherein upon execution of the instructions the controller further:
   obtains a one-dimensional signal or a two-dimensional image as the output of the secondary electron detector;
   obtains the amplitude of the one-dimensional signal or the brightness of the two-dimensional image;
   obtains the relationship between the voltage applied to the sample stage and the amplitude of the one-dimensional signal or the relationship between the voltage applied to the sample stage and the brightness of the two-dimensional image; and
   determines the surface potential of the sample on the basis of the relationship.

3. A charged particle beam system as claimed in claim 1, wherein upon execution of the instructions the controller further:
   obtains a value of the voltage applied to the sample stage for which the output of the secondary electron detector is minimized on the basis of the relationship between the voltage applied to the sample stage and the output of the secondary electron detector; and
   determines the surface potential of the sample depending on the charged particle beam accelerating voltage.

4. A charged particle beam system comprising
   a source of a charged particle beam;
   a secondary electron detector for detecting secondary electrons emitted from a sample;
   a sample stage for supporting the sample;
   a power source for applying a variable voltage to the sample stage, and
   a controller for controlling the power source,
   wherein the controller comprises a computer readable medium containing instructions such that when executed, the controller:
   varies the voltage to be applied to the sample stage;
   measures the output of the secondary electron detector; and
   determines the surface potential of the sample by using that value of the voltage applied to the sample stage for which the output of the secondary electron detector is lower than a predetermined threshold.

5. A charged particle beam system as claimed in claim 4, wherein upon execution of the instructions the controller further:
   obtains a one-dimensional signal or a two-dimensional image as the output of the secondary electron detector;
   obtains the amplitude of the one-dimensional signal or the brightness of the two-dimensional image; and
   determines the surface potential of the sample by using that value of the voltage applied to the sample stage for which the amplitude of the one-dimensional signal or the brightness of the two-dimensional image is less than a predetermined value.

6. A charged particle beam system as claimed in claim 4, wherein upon execution of the instructions the controller further:
   obtains a value of the voltage applied to the sample stage for which the output of the secondary electron detector is minimized; and
   determines the surface potential of the sample depending on the accelerating voltage for the beam of the charged particle.

7. A charged particle beam system as claimed in claim 1, wherein upon execution of the instructions the controller superposes the determined surface potential on the voltage applied to the sample stage.

8. A charged particle beam system as claimed in claim 4, wherein upon execution of the instructions the controller superposes the determined surface potential on the voltage applied to the sample stage.

9. A charged particle beam system as claimed in claim 1, wherein upon execution of the instructions the controller estimates the surface potential at an arbitrary point on the sample surface on the basis of the relationship between the preselected measuring points on the sample and the surface potentials determined at the preselected measuring points.

10. A charged particle beam system as claimed in claim 9, wherein upon execution of the instructions the controller:
  superposes the estimated surface potential on the voltage applied to the sample stage so as to control the sample surface potential; and
  controls the charged particle beam so that it may hit an arbitrary position on the sample surface with a desired kinetic energy.

11. A charged particle beam system as claimed in claim 9, wherein upon execution of the instructions the controller:
  measures the surface potentials at measuring points within a circular area having a predetermined radius, located in the center of the sample, in case of measuring surface potentials at plural measuring points distributed over the sample surface;
  ceases further surface potential measurement is ceased when the measured surface potentials do not exceed a preset threshold; and
  continues the further surface potential measurement when the measured surface potentials exceed the preset threshold.

12. A charged particle beam system as claimed in claim 1, wherein upon execution of the instructions the controller specifys the variable range of the voltage applied to the sample stage.

13. A charged particle beam system comprising:
  a source of a charged particle beam;
  an accelerating electrode for accelerating the charged particle beam emitted from the source of the charged particle beam;
  a first power source for applying a variable voltage to the accelerating electrode;
  a secondary electron detector for detecting secondary electrons emitted from a sample irradiated with the charged particle beam;
  a sample stage for supporting the sample;
  a second power source for applying a variable voltage to the sample stage; and
  a controller for controlling the first and second power source,
  wherein the controller comprises a computer readable medium containing instructions, such that when executed, the controller:
  varies the kinetic energy of the charged particle beam by controlling the voltage of the first power source and/or the voltage of the second power source;
  detects the output of the secondary electron detector while the kinetic energy of the charged particle beam is being varied; and
  determines the potential of the sample surface by using the value of the voltage of the second power source for which the output of the secondary electron detector remains less than a preset threshold.

14. A charged particle beam system as claimed in claim 13, wherein upon execution of the instructions the controller superposes the determined surface voltage separately on the voltage applied to the sample stage or the voltage applied to the accelerating electrode, or distributively on both the voltage applied to the sample stage and the voltage applied to the accelerating electrode.

15. A charged particle beam system as claimed in claim 14, wherein upon execution of the instructions the controller estimates the surface potential at an arbitrary point on the sample surface on the basis of the relationship between the preselected measuring points on the sample and the surface potentials determined at the preselected measuring points.

16. A charged particle beam system as claimed in claim 13, wherein upon execution of the instructions the controller:
  superposes the determined surface voltage separately on the voltage applied to the sample stage or the voltage applied to the accelerating electrode, or distributively on both the voltage applied to the sample stage and the voltage applied to the accelerating electrode, so as to control the surface potential of the sample; and
  controls the charged particle beam so that the beam may hit the sample at an arbitrary position on its surface with a desired kinetic energy.

17. A charged particle beam system as claimed in claim 15, wherein upon execution of the instructions the controller, for the measurement of the surface potentials at plural measuring points distributed over the sample surface:
  initially performs the surface potential measurement at plural measuring points within a circular area having a predetermined radius with its center located at the center of the sample; and
  ceases further surface potential measurement if the surface potentials obtained within the circular area do not exceed a preset threshold, whereas continues the further surface potential measurement at the remaining measuring points distributed over the sample surface if the obtained surface potential exceeds the preset threshold.

18. A charged particle beam system comprising:
  a source of a charged particle beam;
  a secondary electron detector for detecting secondary electrons emitted from a sample;
  a sample stage for supporting the sample;
  a power source for applying a variable voltage to the sample stage; and
  a controller for controlling the power source, wherein the controller comprises a computer readable medium containing instructions, such that when executed, the controller:
  increases the voltage applied to the sample stage in the positive direction, starting at the values for which the charged particle beam does not reach the sample;
  measures the output of the secondary electron detector while the voltage applied to the sample stage is being varied; and
  determines the surface potential of the sample on the basis of the relationship between the varied voltage of the sample stage and the output of the secondary electron detector.

* * * * *